(12) United States Patent
Ishikawa et al.

(10) Patent No.: US 7,084,503 B2
(45) Date of Patent: Aug. 1, 2006

(54) SEMICONDUCTOR DEVICE AND FABRICATING METHOD THEREOF

(75) Inventors: Akira Ishikawa, Atsugi (JP); Shingo Eguchi, Tochigi (JP); Seiji Oda, Kurashiki (JP); Yoshinori Higami, Fukuyama (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 52 days.

(21) Appl. No.: 10/697,987

(22) Filed: Oct. 31, 2003

(65) Prior Publication Data

US 2004/0092059 A1  May 13, 2004

(30) Foreign Application Priority Data

Nov. 5, 2002  (JP) ............................. 2002-320785

(51) Int. Cl.
*H01L 23/48* (2006.01)
*H01L 21/00* (2006.01)

(52) U.S. Cl. ..................... 257/749; 257/459; 438/27; 438/30; 438/614; 438/626; 438/672

(58) Field of Classification Search ................. 438/27, 438/29, 30, 612, 613, 614, 625, 626, 629, 438/672, 972; 257/749, 449, 459, 752
See application file for complete search history.

(56) References Cited

U.S. PATENT DOCUMENTS

| 4,789,648 | A | * | 12/1988 | Chow et al. ................. 438/633 |
| 5,148,259 | A |   | 9/1992 | Kato et al. |
| 5,250,465 | A |   | 10/1993 | Iizuka et al. |
| 5,536,950 | A |   | 7/1996 | Liu et al. |
| 5,706,064 | A |   | 1/1998 | Fukunaga et al. |
| 5,948,705 | A |   | 9/1999 | Jun |
| 5,976,393 | A |   | 11/1999 | Abe |
| 5,990,542 | A |   | 11/1999 | Yamazaki |
| 6,030,904 | A | * | 2/2000 | Grill et al. ................... 438/781 |
| 6,043,149 | A |   | 3/2000 | Jun |
| 6,057,227 | A | * | 5/2000 | Harvey ....................... 438/626 |
| 6,081,305 | A |   | 6/2000 | Sato et al. |
| 6,097,453 | A |   | 8/2000 | Okita |
| 6,130,156 | A | * | 10/2000 | Havemann et al. ......... 438/637 |
| 6,163,055 | A |   | 12/2000 | Hirakata et al. |
| 6,291,334 | B1 | * | 9/2001 | Somekh ....................... 438/620 |
| 6,326,249 | B1 |   | 12/2001 | Yamazaki et al. |
| 6,365,502 | B1 | * | 4/2002 | Paranjpe et al. ............. 438/622 |
| 6,365,506 | B1 | * | 4/2002 | Chang et al. ................ 438/624 |
| 6,468,844 | B1 |   | 10/2002 | Yamazaki et al. |

(Continued)

*Primary Examiner*—Kevin M. Picardat
(74) *Attorney, Agent, or Firm*—Eric J. Robinson; Robinson Intellectual Property Law Office, P.C.

(57) ABSTRACT

The present invention provides a semiconductor device in which occurrence of disclination caused by steps in a contact portion and steps between pixel electrodes is prevented. A method of fabricating a semiconductor device according to the invention includes forming an insulating film 2 on an electrode 1*a* so as to cover the electrode; forming contact holes 2*a* and 2*b* located on the electrode and concave portions 2*c* and 2*d* connected to the contact hole; embedding a conductive film 8 in the contact hole and the concave portion and forming a conductive film 8 on the insulating film; and applying the CMP polishing or the etching-back to the conductive film, and thereby forming a pixel electrode made of the conductive films 8*a* and 8*b* embedded in the contact hole and the concave portion.

27 Claims, 10 Drawing Sheets

U.S. PATENT DOCUMENTS

| | | |
|---|---|---|
| 6,524,947 B1 * | 2/2003 | Subramanian et al. ...... 438/637 |
| 6,556,264 B1 | 4/2003 | Hirakata et al. |
| 6,806,192 B1 * | 10/2004 | Lin et al. .................... 438/687 |
| 6,856,360 B1 * | 2/2005 | Higuchi et al. ............... 349/43 |
| 2002/0000613 A1 * | 1/2002 | Ohtani et al. ............... 257/347 |
| 2003/0193627 A1 | 10/2003 | Hirakata et al. |

* cited by examiner

SEMICONDUCTOR DEVICE AND FABRICATING METHOD THEREOF

BACKGROUND OF THE INVENTION

1. Field of the Invention

The present invention relates to a structure of a contact portion to form a planarized conductive film in a semiconductor device using a thin film. Specifically, the present invention relates to a structure of a contact portion to contact a switching element and a pixel electrode electrically in a pixel region of an active matrix-type liquid crystal display (hereinafter referred to as AMLCD).

2. Description of the Related Art

Recently, technique of fabricating a TFT on an inexpensive glass substrate has been developing with increased demand for AMLCD (Active Matrix-type Liquid Crystal Display).

An AMLCD in which a thin film transistor (TFT) as a switching element is disposed in each of half a million to multimillion pixels arranged in matrix respectively and electric charge which moves in and out each pixel electrode is controlled by switching means of the TFT.

A liquid crystal is sandwiched between each pixel electrode and the opposite electrode to form a kind of a capacitor. Therefore the strength of electric field applied to the liquid crystal is regulated by controlling the amount of electric charge which moves in and out of the capacitor. In this way, a pixel display can be realized by controlling amount of light which transmits a liquid crystal display device according to an electro-optics characteristic of the liquid crystal display device. In addition, an image display can be performed at large by individually controlling the amount of light in each pixel of a panel.

There is a characteristic phenomenon of a display device using such a liquid crystal, which is called a light leakage. A liquid crystal is arranged between a pixel electrode and the opposite electrode with a regular orientation. The alignment disturbance of the liquid crystal is caused due to an inferior rubbing for pattern steps, unevenness of a pixel electrode surface, and a distortion of electric field applied to a liquid crystal when a liquid crystal display device is driven. A light leakage is to have higher light transmittance in the parts where alignment disturbance of a liquid crystal is caused. Specially, in a liquid crystal display device of projection formula, the display grade is widely degraded by a light leakage. In this case, it is difficult to characterize electro-optically as it is to be in the parts where alignment disturbance of a liquid crystal is caused. Typically, a pixel displaying a gradation sequence close to a black level has higher transmittance than the pixel displaying a gradation sequence that should have due to the influence of a light leakage, and results in difficulty in displaying a sufficient black color. As a result, the degradation of display grade and deterioration of contrast are generated.

Previously, a device such as providing a structure in which a TFT is covered by a planarizing film has been made to prevent disclination, it does not become a essential solution in the present condition because of the difficulty in planarization of steps at the contact portion in a pixel electrode which is formed lastly no matter how a planarizing film is used.

FIG. 10 is a sectional pattern view showing a conventional semiconductor device. A drain electrode 101 composed of a metal electrode is formed on a base film which is not shown in the drawing, and an interlayer insulating film 102 is formed thereon. Then, a drain contact hole 102a located on a drain electrode 101 in the interlayer insulating film is formed by providing a resist film on the interlayer insulating film 102, and dry etching the interlayer insulating film 102 by using the resist film as a mask. Next, a pixel electrode 103 connected to a drain electrode 101 in a drain contact hole 102a is formed on the interlayer insulating film 102 by forming a conductive film in the drain contact hole and on the interlayer insulating film and patterning the conductive film. In addition, an overlap region 103a is formed on the pixel electrode 103 to cover the whole inside of a drain contact hole 102 with the pixel electrode 103.

In regard to the planarization of a TFT substrate surface, measures are taken against the opening region and the wiring vicinity, the steps of the drain contact hole to provide continuity across the pixel electrode and the TFT is left as it is as shown in FIG. 10. These steps are expected to cause alignment disturbance of liquid crystal and bad influence on rubbing process of the following processes.

SUMMARY OF THE INVENTION

The present invention is proposed in consideration of the above problems, and therefore, it is an object of the present invention to provide technique on a structure of a contact portion in order to form a planarized conductive film.

Specially, it is more specific object of the present invention to level a pixel electrode of an AMLCD sufficiently and to prevent the occurrence of disclination caused by steps in a contact portion and steps between pixel electrodes.

In order to overcome the above problems, a semiconductor device according to the present invention includes an insulating film formed on an electrode so as to cover the electrode; a contact hole that is formed in the insulating film and disposed on the electrode; a concave portion formed in the insulating film and formed connected with the contact hole; and a pixel electrode embedded in the contact hole and the concave portion.

A semiconductor device according to the invention includes a first insulating film formed on an electrode so as to cover the electrode; a stopper film formed on the first insulating film; a second insulating film formed on the stopper film; a concave portion formed in the second insulating film by etching the second insulating film with the stopper film as an etching stopper; a contact hole formed in the stopper film and the first insulating film by etching the stopper film and the first insulating film and located under the concave portion and above the electrode; and a pixel electrode embedded in the contact hole and the concave portion.

A semiconductor device according to the invention includes a first insulating film formed on an electrode so as to cover the electrode; a stopper film formed on the first insulating film; a second insulating film formed on the stopper film; a contact hole formed in the stopper film and the first insulating film by etching the second insulating film, the stopper film and the first insulating film and located on the electrode; a concave portion formed in the second insulating film by etching the second insulating film with the stopper film as an etching stopper and connected to the contact hole; and a pixel electrode embedded in the contact hole and the concave portion.

A semiconductor device according to the invention includes an insulating film formed on an electrode so as to cover the electrode; a contact hole formed in the insulating film and located on the electrode; a conductive film embedded in the contact hole; and a pixel electrode formed on the insulating film and an embedded conductive film.

A semiconductor device according to the invention includes an insulating film formed on an electrode so as to cover the electrode; a contact hole formed in the insulating film and located on the electrode; and a pixel electrode embedded in the contact hole and formed on the insulating film.

Furthermore, in a semiconductor device according to the invention, the electrode may be a drain electrode of a TFT.

A method of fabricating a semiconductor device according to the invention includes forming an insulating film on an electrode so as to cover the electrode; forming a contact hole in the insulating film located on the electrode and a concave portion connected to the contact hole; embedding a conductive film in the contact hole and the concave portion and forming a conductive film on the insulating film; and forming a pixel electrode made of the conductive film embedded in the contact hole and the concave portion by applying CMP polishing or etching-back to the conductive film.

According to the method of fabricating a semiconductor device, by filling a whole of the inside of the contact hole with a conductive film, steps due to the contact hole can be prevented from occurring. Furthermore, by filling a whole of the inside of the concave portion with a conductive film and by applying the CMP polishing or etching back to the conductive film, steps between the insulating film and the pixel electrode can be prevented from occurring. Thereby, the disclination due to the steps can be prevented from occurring.

A method of fabricating a semiconductor device according to the invention includes forming a first insulating film on an electrode so as to cover the electrode; forming a stopper film on the first insulating film; forming a second insulating film on the stopper film; etching the second insulating film with the stopper film as an etching stopper and thereby forming a concave portion in the second insulating film; etching the stopper film and the first insulating film and thereby forming a contact hole in the stopper film and the first insulating film located below the concave portion and above the electrode; filling a conductive film in the contact hole and the concave portion and forming a conductive film on the second insulating film; and applying the CMP polishing or the etching-back to the conductive film, and thereby forming a pixel electrode made of the conductive film embedded in the contact hole and the concave portion.

As the stopper film, any film that can serve as an etching stopper when the second insulating film is etched can be used.

A method of fabricating a semiconductor device according to the invention includes forming a first insulating film on an electrode so as to cover the electrode; forming a stopper film on the first insulating film; forming a second insulating film on the stopper film; etching the second insulating film, the stopper film and the first insulating film and thereby forming a contact hole in the stopper film and the first insulating film located above the electrode; etching the second insulating film with the stopper film as an etching stopper and thereby forming, in the second insulating film, a concave portion connected to the contact hole; embedding a conductive film in the contact hole and the concave portion and forming a conductive film on the second insulating film; and applying the CMP polishing or the etching-back to the conductive film, and thereby forming a pixel electrode made of the conductive film embedded in the contact hole and the concave portion.

A method of fabricating a semiconductor device according to the invention includes forming an insulating film on an electrode so as to cover the electrode; etching the insulating film and thereby forming a concave portion in the insulating film; etching the insulating film and thereby forming a contact hole in the insulating film located below the concave portion and above the electrode; embedding a conductive film in the contact hole and the concave portion and forming a conductive film on the insulating film; and applying the CMP polishing or the etching-back to the conductive film, and thereby forming a pixel electrode made of the conductive film embedded in the contact hole and the concave portion.

A method of fabricating a semiconductor device according to the invention includes forming an insulating film on an electrode so as to cover the electrode; etching the insulating film and thereby forming a contact hole located above the electrode; etching the insulating film and thereby forming a concave portion in the insulating film connected to the contact hole; embedding a conductive film in the contact hole and the concave portion and forming a conductive film on the insulating film; and applying the CMP polishing or the etching-back to the conductive film, and thereby forming a pixel electrode made of the conductive film embedded in the contact hole and the concave portion.

A method of fabricating a semiconductor device according to the invention includes forming an insulating film on an electrode so as to cover the electrode; forming a contact hole in the insulating film located above the electrode; embedding a conductive film in the contact hole and forming a conductive film on the insulating film; applying the CMP polishing or the etching-back to the conductive film, and thereby removing the conductive film present on the insulating film with the conductive film embedded in the contact hole remained; and forming a pixel electrode on the insulating film and the embedded conductive film.

According to the method of fabricating a semiconductor device, by filling a conductive film in the whole of the inside of the contact hole, steps due to the contact hole can be inhibited from occurring. Accordingly, the disclination due to the steps can be prevented from occurring.

A method of fabricating a semiconductor device according to the invention includes forming an insulating film on an electrode so as to cover the electrode; forming a contact hole in the insulating film located above the electrode; embedding a first ITO film in the contact hole and forming the first ITO film on the insulating film; applying the CMP polishing or the etching-back to the first ITO film, and thereby removing the first ITO film present on the insulating film with the first ITO film embedded in the contact hole remained; baking the embedded first ITO film; forming a second ITO film on the insulating film and the embedded first ITO film; and etching the second ITO film, and thereby forming, on the insulating film and the embedded first ITO film, a transparent electrode made of the second ITO film.

According to the method of fabricating a semiconductor device, since the transparent electrode is formed on the embedded first ITO film, when the second ITO film is etched, even when the transparent electrode does not cover a whole of the first ITO film, since the first ITO film is baked, the first ITO film is not etched. As a result, the first ITO film embedded in the contact hole can be inhibited from disconnecting.

A method of fabricating a semiconductor device according to the invention includes forming an insulating film on an electrode so as to cover the electrode; forming a contact hole in the insulating film located above the electrode;

embedding a conductive film in the contact hole and forming a conductive film on the insulating film; applying the etching-back or the CMP polishing to the conductive film, and thereby thinning a thickness of the conductive film present on the insulating film; and etching the conductive film, and thereby forming a pixel electrode made of the conductive film on the insulating film.

According to the method of fabricating a semiconductor device, since the pixel electrode is formed on the insulating film, when the conductive film is etched, even when the pixel electrode does not cover the whole of the contact hole, the conductive film embedded in the contact hole can be inhibited from disconnecting.

DESCRIPTION OF THE PREFERRED EMBODIMENTS

In the following, with reference to the drawings, Embodiment Modes for carrying out the present invention will be explained.

Figure 1A:
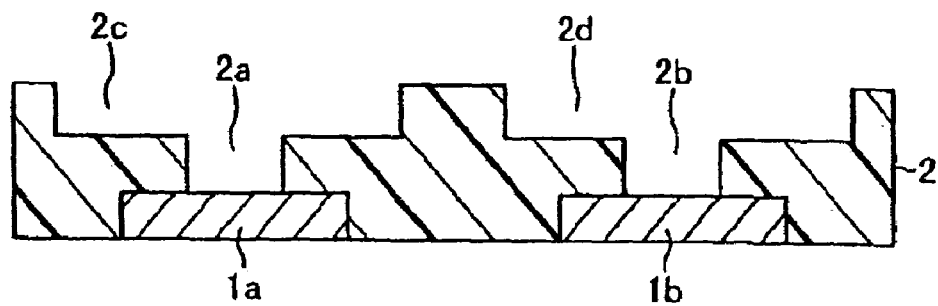
FIGS. 1A to 1C are sectional views showing a fabricating method of an AMLCD which is one example of semiconductor devices according to the Embodiment Mode 1 of the present invention.
Figure 1B:
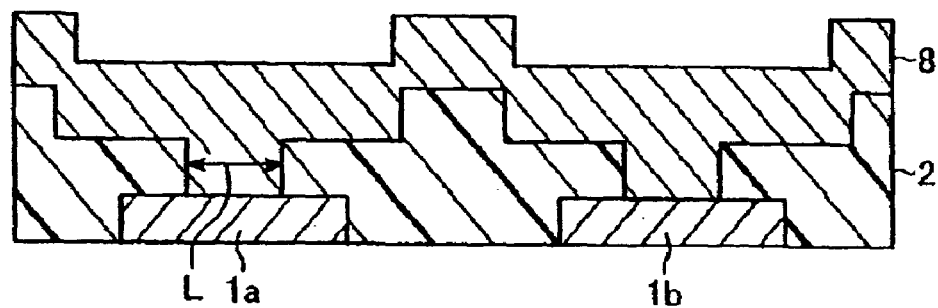
Figure 1C:
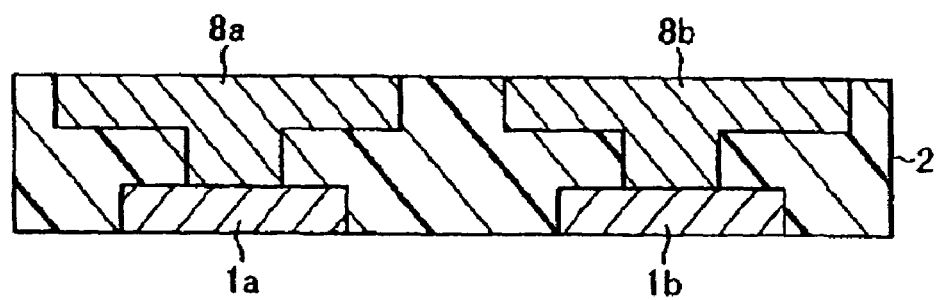

FIGS. 1A to 1C are sectional views showing a fabrication method of an AMLCD that is an example of a semiconductor device according to a first Embodiment Mode for carrying out the invention. FIGS. 2A to 2D are sectional views showing an example of a fabrication method that realizes a state shown in FIG. 1A.

As shown in FIG. 1A, on a base film (not shown in the drawing), a conductive film is formed, this conductive film is patterned, and thereby, on the base film, electrodes 1a and 1b made of the conductive film are formed. The electrodes 1a and 1b may be various metal electrodes such as, for instance, a drain electrode and so on. However, not only to the electrode which is directly connected to a semiconductor film, but also wiring in an upper part may be used as the electrodes 1a and 1b. Furthermore, an insulating film, semiconductor film or conductive film may be used as the base film, for instance.

Subsequently, insulating film 2 is formed on the electrodes 1a and 1b and the base film. Thereby, the electrodes 1a and 1b are covered with the insulating film 2. Although insulating films made of various materials can be used as the insulating film 2, an insulating film containing silicon such as silicon oxide, silicon nitride, silicon oxide nitride and so on or a single layer or a laminate of organic resin films may be used therefore. In the next place, by processing the insulating film 2, contact holes 2a and 2b in the insulating film 2 positioned on the respective electrodes 1a and 1b and concave portions 2c and 2d are formed.

Next, a method of processing the insulating film 2 into a state of FIG. 1A will be explained with reference to FIGS. 2A to 2D.

Figure 2A:
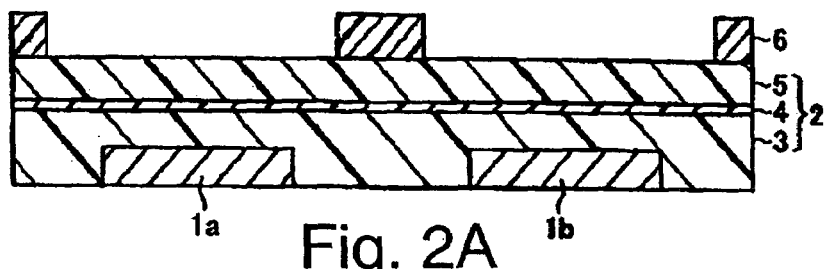
FIGS. 2A to 2D are one example of fabricating methods to realize the condition shown in FIG. 1A.

As shown in FIG. 2A, electrodes 1a and 1b are formed on the base film (not shown in the drawing) by forming an interlayer insulating film 3 on the electrodes 1a and 1b by means of a CVD (chemical vapor deposition) method. For the interlayer insulating film 3, for instance, a film made of such as $SiO_2$, SiON, SiNO or the like is used.

Subsequently, the interlayer insulating film 3 is subjected to CMP (Chemical Mechanical Polishing) to planarize the interlayer insulating film 3. Still subsequently, on the planarized interlayer insulating film 3, silicon nitride film 4 having a film thickness of 100 nm or less is formed by means of a CVD method or a sputtering method. Subsequently, on the silicon nitride film 4, silicon oxide film 5 is formed by means of a CVD method or a sputtering method. A film thickness of the silicon oxide film 5 is set at a thickness that is obtained by adding a process margin to a finishing film thickness of a pixel electrode. The insulating film 2 is formed of these interlayer insulating film 3, silicon nitride film 4 and silicon oxide film 5. Subsequently, a resist film is coated on the silicon oxide film 5 by exposing and developing the resist film, and thereby on the silicon oxide film 5, a resist pattern 6 is formed.

Figure 2B:
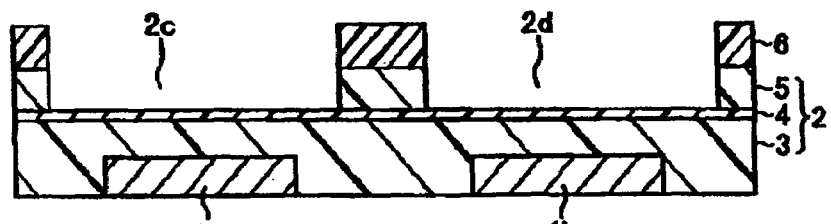

In the next place, the silicon oxide film 5 is etched with the resist pattern 6 as a mask as shown in FIG. 2B. At this time, either of wet etching and dry etching can be applied, and the silicon nitride film 4 serves as an etching stopper. Thereby, in the silicon oxide film 5, concave portions are formed.

Figure 2C:
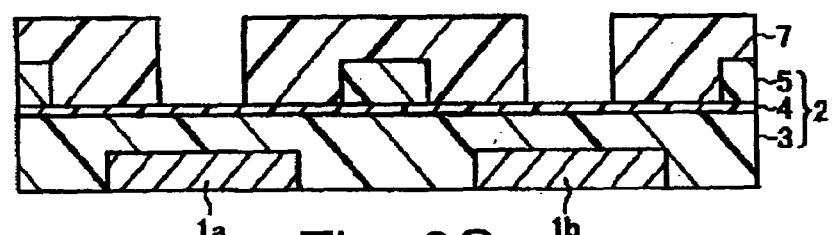

Thereafter, as shown in FIG. 2C, the resist pattern 6 is peeled followed by coating a resist film on the silicon nitride film 4 and the silicon oxide film 5 further followed by exposing and developing the resist film, and thereby on the silicon nitride and the silicon oxide film a resist pattern 7 is formed.

Figure 2D:
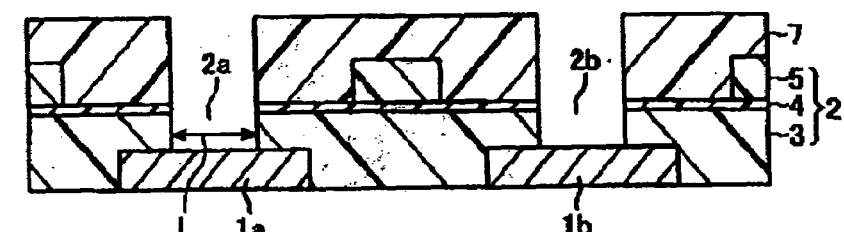

Subsequently, as shown in FIG. 2D, with the resist pattern 7 as a mask, the silicon nitride film 4 is etched. At this time, either of the wet etching and dry etching can be applied. Still subsequently, with the resist pattern 7 as a mask, the interlayer insulating film 3 is etched. At this time, either of the wet etching and dry etching can be applied. Thereby, in the silicon nitride film 4 and the interlayer insulating film 3, contact holes 2a and 2b positioned on the corresponding electrodes 1a and 1b are formed. In the next place, the resist pattern 7 is peeled. Thus, the contact holes 2a and 2b and the concave portions 2c and 2d as shown in FIG. 1A are formed in the insulating film 2. A diameter L of the contact holes 2a and 2b is preferably two times or less of a finishing film thickness of the pixel electrode but this is not a necessary condition.

As a method of processing the insulating film 2 into a state shown in FIG. 1A, without restricting to the above method, other methods can be used or the above method can be slightly modified and used. For instance, when the concave portions 2c and 2d are formed in the silicon oxide film 5 by means of etching, the silicon nitride film 4 is used as the etching stopper; however, without using the silicon nitride film 4, the concave portions 2c and 2d can be formed in the insulating film 2. In this case, control of an etching time precisely allows controlling an etching depth of the concave portions 2c and 2d.

Furthermore, according to the method shown in FIGS. 2A to 2D, after the concave portions 2c and 2d are formed in the silicon oxide film 5, the contact holes 2a and 2b are formed in the interlayer insulating film 3; however, it is also possible that after the contact holes 2a and 2b are formed in the interlayer insulating film 3, the concave portions 2c and 2d are formed in the silicon oxide film 5. That is, it is also possible that by etching the silicon oxide film 5, silicon nitride film 4 and the interlayer insulating film 3, the contact holes 2a and 2b are formed in the interlayer insulating film 3 followed by etching the silicon oxide film 5 with the silicon nitride film 4 as an etching stopper, and thereby the concave portions 2c and 2d are formed in the silicon oxide film 5.

After processing into a state shown in FIG. 1A, conductive film 8 is formed in the contact holes 2a and 2b and the concave portions 2c and 2d and on the insulating film 2 as shown in FIG. 1B. As the conductive film 8, an ITO (indium tin oxide) film formed by means of a sputtering method also can be used for instance. A film thickness of the conductive film 8 is preferably a half or more a diameter L of the contact hole and the whole inside of the contact hole is filled with the conductive film 8. Subsequently, the embedded conductive film 8 is baked, if necessary.

Figure 2E:
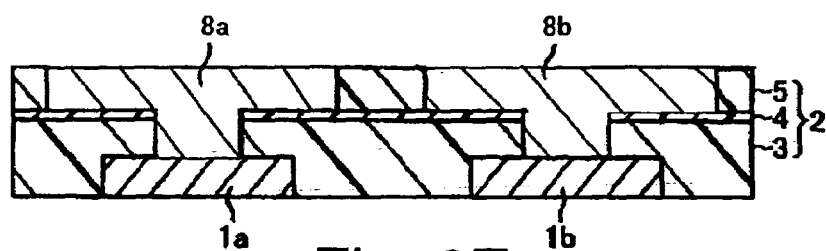
FIG. 2E is an another example of semiconductor devices according to the Embodiment Mode 1 of the present invention.

Subsequently, the conductive film 8 is subjected to the CMP polishing as shown in FIG. 1C. At this time, the insulating film 2 is used as a stopper. Thereby, the conductive film 8 is planarized, embedded conductive films 8a and 8b are formed in the concave portions of the insulating film 2, and the embedded conductive films 8a and 8b are electrically connected to the electrodes 1a and 1b in the contact holes. The embedded conductive films 8a and 8b are preferably made of the same material as that of the pixel electrode, for instance, ITO and so on that is a transparent electrode material is preferable in a transmissive liquid crystal display device, and a metal having the reflectivity is preferable in a reflective liquid crystal display device. Embedded conductive films 8a and 8b can be formed in a similar way in case of forming the contact holes 2a and 2b and the concave portions 2c and 2d using the method shown by FIGS. 2A to 2D as shown in FIG. 2E. In the CMP polishing process, when taking the polishing margin and so on into consideration, a height of the projection (the projection indicates the part of the silicon oxide film 5 between the concave portion 2c and the concave portion 2d) is preferably relatively high; furthermore, when taking use of the steps due to the projection for orientation regulation into consideration, it is important to accurately control a height of the projection. However, according to the above method, height of the projection also can be easily controlled.

According to the above first Embodiment Mode for carrying out the invention, by embedding conductive film in the whole of the inside of the contact holes 2a and 2b, the steps due to the contact hole can be inhibited from occurring. Furthermore, by embedding the pixel electrode in the whole of the inside of the concave portions 2c and 2d and by applying the CMP polishing to the conductive film with the insulating film 2 as a stopper, the steps between the insulating film 2 and the pixel electrode can be inhibited from generating. Thereby, the discrimination due to the steps can be inhibited from occurring, alignment disturbance of liquid crystal affected by the steps can be also inhibited from occurring, resulting in uniform rubbing on a whole surface can be achieved.

In the first Embodiment Mode for carrying out the invention, by applying the CMP polishing to the conductive film 8, the embedded conductive films 8a and 8b are formed in the concave portions of the insulating film 2; however, it is also possible to form the embedded conductive films 8a and 8b in the concave portions of the insulating film 2 by applying the etching-back to the conductive film 8.

FIGS. 3A to 3D are sectional views showing a method of fabricating an AMLCD that is an example of a semiconductor device according to a second Embodiment Mode for carrying out the invention; the same portions as FIGS. 1A to 1C are given the same reference numerals.

Figure 3A:
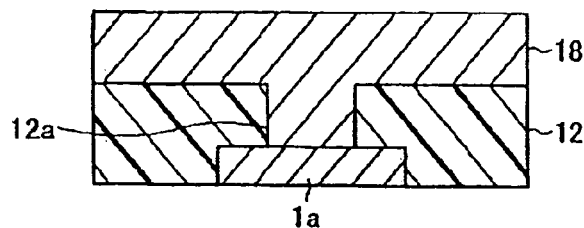
FIGS. 3A to 3D are sectional views showing a fabricating method of an AMLCD which is one example of semiconductor devices according to the Embodiment Mode 2 of the present invention.

Up to a process where an electrode 1a shown in FIG. 3A is formed on a base film (not shown in the drawing), the situations are the same as that of the first Embodiment Mode.

In the next place, an interlayer insulating film 12 is formed on the electrode 1a and the base film formed by means of a CVD method. Thereby, the electrode 1a is covered with the interlayer insulating film 12. For the interlayer insulating film 12, an insulating film made of various materials can be used; for instance, a film made of $SiO_2$, SiON, SiNO or the like can be used.

Subsequently, by applying the CMP polishing to the interlayer insulating film 12, the interlayer insulating film 12 is planarized. Still subsequently, on the planarized interlayer insulating film 12, a resist film (not shown in the drawing) is coated followed by exposing and developing the resist film, and thereby a resist pattern is formed on the interlayer insulating film 12. Next, the interlayer insulating film 12 is etched with the resist pattern as a mask. At this time, the etching may be either of the dry etching and the wet etching. Thereby, in the interlayer insulating film 12, a contact hole 12a positioned above the electrode 1a is formed. Then, the resist pattern is peeled.

In the next place, in the contact hole 12a and on the interlayer insulating film 12, first conductive film 18 is formed. For the first conductive film 18, a film that does not cause the electric corrosion when coming into contact with the ITO such as an ITO film, W film, TiW film or the like is preferably used in the case of a second conductive film that is later formed being ITO. A film thickness of the first conductive film 18 is preferably one half a diameter of the contact hole or more; the first conductive film 18 embeds the whole of the inside of the contact hole. Then, when an ITO film is used for the first conductive film 18, the baking may be applied, if necessary.

Figure 3B:
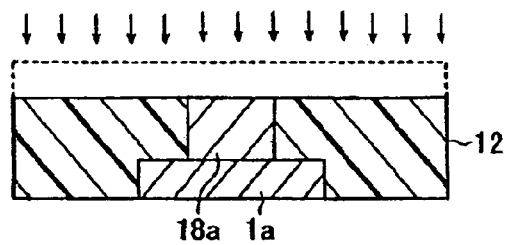

Thereafter the first conductive film 18 is etched back by a thickness of the deposited first conductive film 18 as shown in FIG. 3B. At this time, either of the dry etching and wet etching can be used; however, in the case of an ITO film is used for the first conductive film 18 and the ITO film is not baked, the wet etching is preferably used. A conductive film 18a is thus embedded in the contact hole 12a, the interlayer insulating film 12 including the embedded conductive film 18a is planarized, and the embedded conductive film 18a is electrically connected to the electrode 1a in the contact hole. Instead of the etching-back of the conductive film 18, the conductive film 18 may be subjected to the CMP polishing.

Figure 3C:
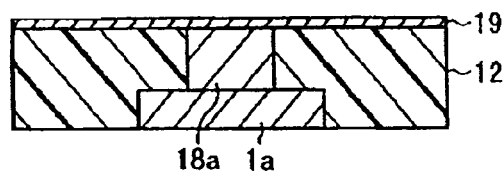

In the next place, a second conductive film 19 is formed on the embedded conductive film 18a and the interlayer insulating film 12 as shown in FIG. 3C. For the second conductive film, a film that is same material as the material of the pixel electrode is preferably used. Furthermore one that is higher in the etching rate than the first conductive film is preferably used as the second conductive film.

Figure 3D:
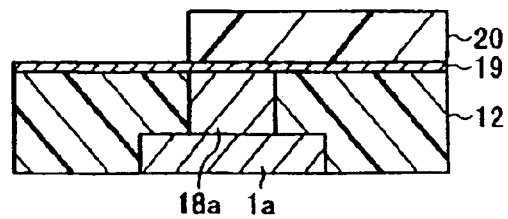

Thereafter, a resist film is coated on the second conductive film 19 followed by exposing and developing the resist film, and thereby a resist pattern 20 is formed on the second conductive film 19 as shown in FIG. 3D.

Figure 3E:
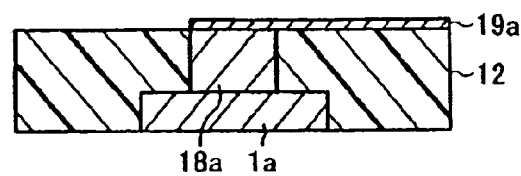

Subsequently, the second conductive film 19 is etched with the resist pattern 20 as a mask. At this time, either of the wet etching and the dry etching may be used. Next, the resist pattern 20 is peeled. Thereby, on the embedded conductive film 18a and the interlayer insulating film 12, the patterned conductive film 19a made of the second conductive film is formed as shown in FIG. 3E. In the next place, when the patterned conductive film 19a is made of an ITO film, the baking is preferably applied. The patterned conductive film 19a may become a transparent electrode (pixel electrode) for instance.

Figure 10:
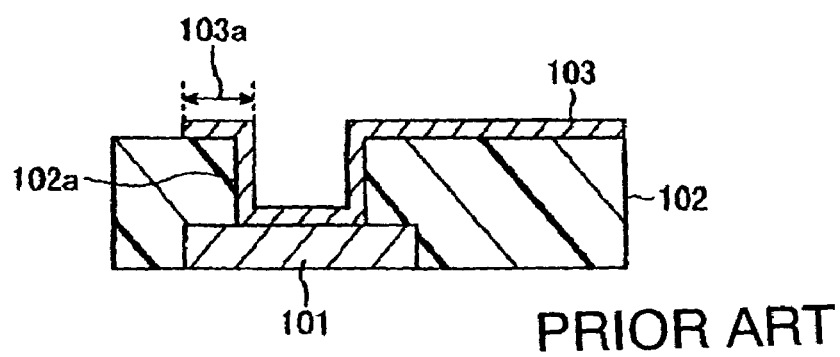
FIG. 10 is a sectional pattern view of a conventional semiconductor device.

When an ITO film is used in the second conductive film 19, and the second conductive film 19 is subjected to the wet etching with the resist pattern 20 as a mask, even in the case where the resist pattern 20 does not wholly cover the embedded conductive film 18a, when with an ITO film for the embedded conductive film 18a and the embedded conductive film 18a is subjected to the baking, the embedded conductive film 18a is not deeply etched since the etching rate of the embedded conductive film 18a is lower than that of the conductive film 19. That is, even when the patterned conductive film 19a does not cover the whole of the embedded conductive film 18a, there is no risk of the embedded conductive film 18a being disconnected since the embedded conductive film 18a formed of the baked ITO is not deeply etched. Accordingly, by applying the present Embodiment Mode for carrying out the invention, such a region as that corresponds to an overlap region 103a shown in FIG. 10 that is the existing technology can be reduced, resulting in an improvement in an aperture area.

Furthermore, in the second Embodiment Mode for carrying out the invention, by embedding the conductive film 18a in the whole of the inside of the contact hole 12a, the steps due to the contact hole can be suppressed from occurring. Accordingly, the disclination due to the steps can be inhibited from occurring, the alignment disturbance of the liquid crystal influenced by the steps can be inhibited, resulting in uniform rubbing on a whole surface can be achieved.

Still furthermore, in the case of the present Embodiment Mode being applied to a surface of a TFT substrate, the surface of a TFT substrate can be planarized, resulting in an influence of the steps in a laminating process with an opposite substrate such as the rubbing can be reduced.

FIGS. 4A to 4D are sectional views showing a method of fabricating an AMLCD that is an example of a semiconductor device according to a third Embodiment Mode for carrying out the invention; portions which are the same as those shown in FIG. 3A to 3D are given the same reference numerals.

Figure 4A:
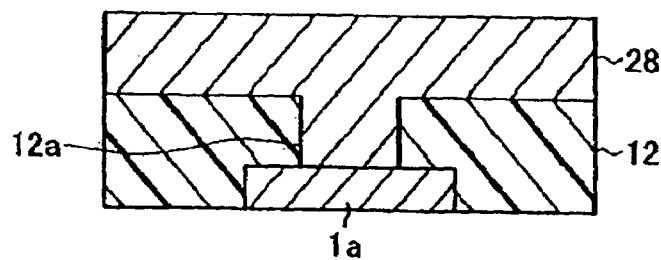
FIGS. 4A to 4D are sectional views showing a fabricating method of an AMLCD which is one example of semiconductor devices according to the Embodiment Mode 3 of the present invention.

Up to a process where a contact hole 12a is formed in an interlayer insulating film 12 shown in FIG. 4A, the processes are carried out similarly to the second Embodiment Mode for carrying out the invention.

In the next place, a conductive film 28 is formed in the contact hole 12a and on an interlayer insulating film 12. For the conductive film 28, a film that becomes a pixel electrode material, for instance, an ITO film can be preferably used. A film thickness of the conductive film 28 is preferably one half a diameter of the contact hole or more and the whole of the inside of the contact hole is buried with the conductive film 28.

Figure 4B:
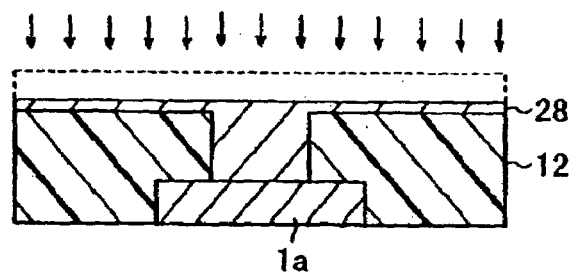

Thereafter the conductive film 28 is etched back, and thereby a film thickness of the conductive film on the interlayer insulating film 12 is controlled to a predetermined thickness as shown in FIG. 4B. As a controlling method at this time, an etching time is used to control for instance. The etching-back may be carried out according to either of the dry etching and the wet etching. Thus, the conductive film 28 is embedded in the contact hole 12a, and the conductive film 28 is electrically connected to an electrode 1a in the contact hole. As a method of controlling a film thickness of the conductive film to a predetermined thickness, other methods than the etching-back may be applied, that is, by means of the CMP polishing, a film thickness of the conductive film may be controlled to a predetermined thickness. In this case, the control can be preferably performed by means of the polishing conditions such as the polishing time and so on.

Figure 4C:
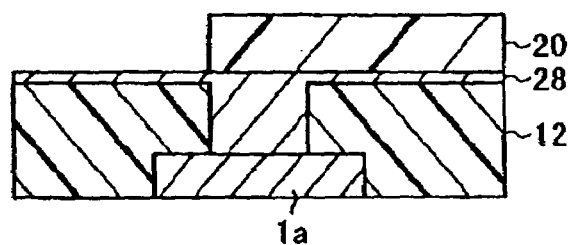

Subsequently, as shown in FIG. 4C, a resist film is coated on the conductive film 28 followed by exposing and developing the resist film, and thereby on the conductive film 28 a resist pattern 20 is formed.

Figure 4D:
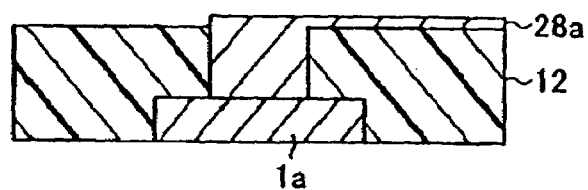

In the next place, the conductive film 28 is etched with the resist pattern 20 as a mask. At this time, the etching may be either of the dry etching and the wet etching. Subsequently, the resist pattern 20 is peeled. Thereby on the contact hole and the interlayer insulating film 12 a patterned conductive film 28a is formed, and the patterned conductive film 28a is electrically connected to the electrode 1a in the contact hole as shown in FIG. 4D. Then, in the case of the patterned conductive film 28a being formed of an ITO film, the baking is preferably applied. The patterned conductive film 28a can be a pixel electrode for instance.

Even in the case of the resist pattern 20 not covering the whole of the contact hole 12a, a depth of the contact hole is large enough in comparison with a thickness of the pixel electrode, the patterned conductive film 28a can be inhibited from disconnecting in the contact hole. Accordingly, when the present Embodiment Mode for carrying out the invention is applied, a region corresponding to an overlapping region 103a shown in FIG. 10 that is a conventional technology can be reduced, resulting in an improvement in an aperture area can be achieved.

Furthermore, in the third Embodiment Mode for carrying out the invention, by burying the whole of the inside of the contact hole 12a with the conductive film 28, steps due to the contact hole can be reduced. Accordingly, the rubbing can be performed without being adversely affected by the steps and the alignment disturbance of the liquid crystal influenced by the steps can be suppressed from occurring, resulting in reduced occurrence of light leakage.

Still furthermore, in the case of the third Embodiment Mode for carrying out the present invention being applied to a TFT substrate surface, the TFT substrate surface can be planarized and an influence due to the steps in the process of laminating with an opposite substrate can be lowered.

The present invention is not restricted to the above embodiment Modes for carrying out the invention and can be variously modified and applied.

EMBODIMENTS

Embodiment 1

FIGS. 5A to 7C are sectional views showing a method of fabricating an AMLCD as an example of a semiconductor device according to Embodiment 1 of the present invention. The AMLCD is driven in the reflective mode.

Figure 5A:
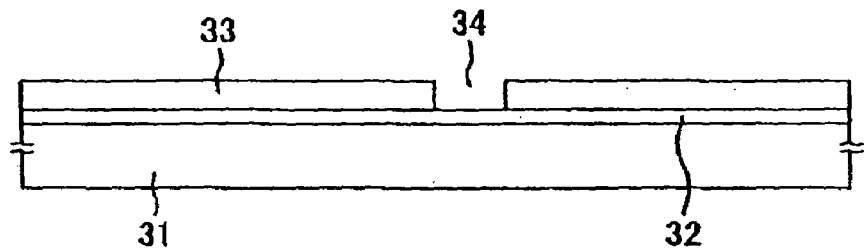
FIGS. 5A to 5D are sectional views showing a fabricating method of an AMLCD which is one example of semiconductor devices according to the Embodiment 1 of the present invention.

To begin with, a quartz substrate 31 is prepared as a substrate, and thereon a silicon oxide film (not shown in the drawing) having a thickness of 20 μm and amorphous silicon film 32 are successively formed without exposing to air as shown in FIG. 5A. By thus executing, a bottom surface of the amorphous silicon film 32 can be inhibited from adsorbing impurities such as boron and so on contained in the air.

Although the amorphous silicon film is used in the present embodiment, other semiconductor films may be used, that is, an amorphous silicon germanium film also may be used.

Subsequently, the amorphous silicon film 32 is crystallized. In the embodiment a technique described in Japanese Laid-Open Patent Application No. 09-312260 is used as crystallizing means. According to the technique described in the document, an amorphous silicon film is crystallized using a solid growth process in which an element selected from nickel, cobalt, palladium, germanium, platinum, iron and copper is used as a catalyst element that promotes the crystallization.

In the present embodiment, nickel is selected as the catalyst element, on the amorphous silicon film 32 a layer containing nickel (not shown in the drawing) is formed, and then heating at 550 degree centigrade for 4 hours are conducted to crystallize, and thereby a crystalline silicon (polysilicon) film is obtained.

In the next place, masking film 33 made of a silicon oxide film having a thickness of 100 nm is formed on the crystalline silicon film, and thereon a resist mask (not shown in the drawing) is formed. Subsequently, the masking film 33 is etched with the resist mask as a mask, and thereby opening 34 is formed in the masking film 33.

Figure 5B:
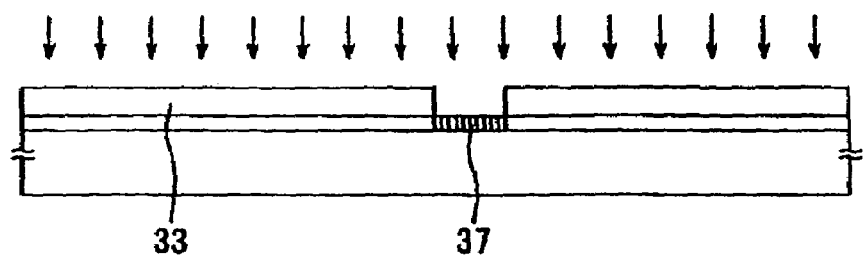

Subsequently, an element (phophorus in the embodiment) belonging to 15 group of the periodic table is added, with the masking film 33 as a mask as shown in FIG. 5B. Thereby, phosphorus-doped region (phosphorus-added region) 37 is formed in the crystalline silicon film. A concentration of phophorus that is added is preferably in the range of from $5\times10^{18}$ to $1\times10^{20}$ atoms/cm$^3$ and more preferably from $1\times10^{19}$ to $5\times10^{19}$ atoms/cm$^3$. A concentration of phosphorus to be added varies according to a temperature and a time of a later gettering process, and furthermore to an area of the phosphorus-doped region; accordingly, the concentration is not restricted to the above range.

Figure 5C:
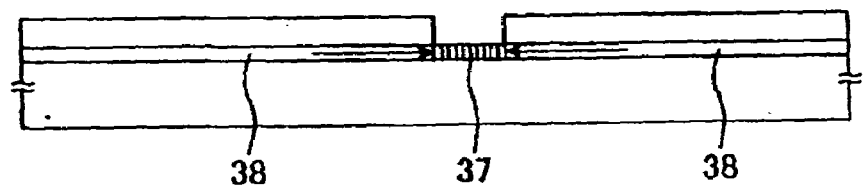

Still subsequently, a heating at a temperature in the range of from 450 to 650 degree centigrade (preferably from 500 to 600 degree centigrade) for from 2 to 16 hours is conducted, and thereby the gettering of nickel remaining in the crystalline silicon film is performed as shown in FIG. 5C. In order to obtain the gettering effect, a temperature of a maximum temperature of thermal treatments ±50 degree centigrade or so is necessary. Since the heating for crystallization is carried out at from 550 to 600 degree centigrade, the heating at from 500 to 650 degree centigrade can sufficiently provide the gettering effect.

In the embodiment, the heat treatment is applied at 600 degree centigrade for 8 hours and thereby nickel is moved in an arrow mark direction shown in FIG. 5C and gettered in a phosphorus-doped region 37. Thus, a concentration of nickel remaining in the crystalline silicon film is reduced to $2\times10^{17}$ atoms/cm$^3$ or less (preferably $1\times10^{16}$ atoms/cm$^3$ or less), and thereby a gettered region 38 can be obtained. The concentration is a measurement by secondary ion mass spectrometry (SIMS); because of a present measurement limit, a concentration smaller than this has not been confirmed.

Figure 5D:
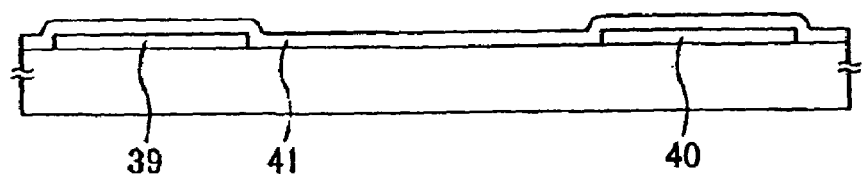

When the gettering process has come to completion, active layers 39 and 40, made of the gettered region 38 only, are formed by patterning the gettered region 38 after removing the masking film 33 as shown in FIG. 5D. At that time, the phosphorus-added region that has captured nickel is preferably completely removed. Subsequently, a gate insulating film 41 is formed by means of a plasma CVD or the sputtering method. The gate insulating film is an insulating film that will function as a gate insulating film of a pixel TFT and has a film thickness in the range of from 50 to 200 nm. In the present embodiment, a silicon oxide film having a thickness of 75 nm is used. Furthermore, other insulating film containing silicon may be used singly or laminated.

Figure 6A:
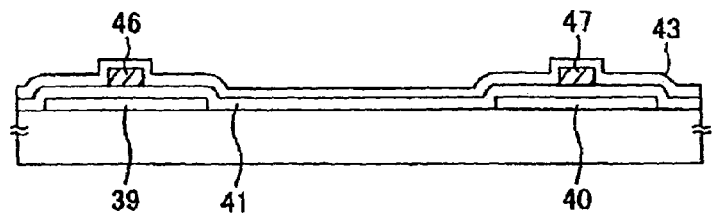
FIGS. 6 A to 6D are sectional views showing a process following FIG. 5D and show a fabricating method of an AMLCD as one example of semiconductor devices according to Embodiment 1 of the present invention.

In the next place, as shown in FIG. 6A, gate electrodes (gate wirings) 46 and 47 are formed on the gate insulating film 41. In the embodiment, as the gate electrode, a laminate film stacked from bottom up in order of silicon film (conductive one)/tungsten nitride film/tungsten film (or from bottom up in order of silicon film/tungsten silicide film) is used. It is without saying that other conductive films than this can be used. Furthermore, in the embodiment, film thicknesses of the gate electrodes are set at 250 nm.

Subsequently, a SiNxOy (typically, x=0.5~2, and Y=0.1~0.8) film having a film thickness of from 25 to 50 nm is formed as a protective film 43 with the gate electrodes 46 and 47 covered. The protective film 43 inhibits the gate electrodes 46 and 47 from being oxidized. When the deposition is divided in two times, it is effective in reducing pinholes.

At this time, as the pretreatment of the formation of the protective film 43, the plasma process with a gas containing hydrogen (ammonia gas in the embodiment) can be effectively applied. Since hydrogen that is plasma-activated (excited) according to the pretreatment is confined in an active layer (semiconductor film), the hydrogen termination can be effectively performed.

It is without saying that in place of the SiNxOy film as the protective film 43, a silicon oxide film, a silicon nitride film or a laminate film thereof can be used.

Figure 6B:
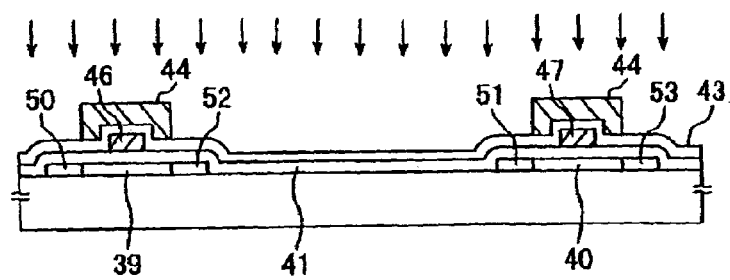

Thus, a state shown in FIG. 6A is obtained. Subsequently, on the protective film 43 masking film 44 made of a resist mask or the like is disposed as shown in FIG. 6B. The masking film 44 is formed so as to cover the gate electrodes 46 and 47 and an LDD region (lightly doped drain region) of a TFT.

Subsequently, to the active layers (semiconductor layers) 39 and 40, an element belonging to a 15 group of the periodic table (phosphorus in the present embodiment) is added. At this time, source regions 50 and 51 and drain regions 52 and 53 are formed in the active layers 39 and 40 with the masking film 44 as a mask. Concentration of phosphorus added to the source regions and the drain regions are controlled so as to be from $5\times10^{19}$ to $1\times10^{21}$ atoms/cm$^3$.

In this process, an ion implantation method with mass separation may be used or a plasma doping method without mass separation may be used. Furthermore, a practitioner may set conditions such as an accelerating voltage and a dose amount at the optimum values.

Figure 6C:
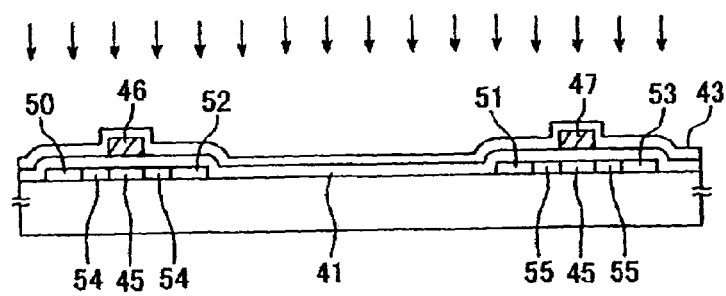

When a state shown in FIG. 6B has been thus obtained, the masking film 44 is removed, and phosphorus is once more added as shown in FIG. 6C. In the process, a dose amount lower than in the previous phosphorus addition process is used to add. Thus, in a region where phosphorus has not been added owing to the masking film 44 as a mask, lightly doped impurity regions 54 and 55 are formed. A concentration of phosphorus added to the lightly doped impurity region is controlled so as to be in the range of from $5 \times 10^{17}$ to $5 \times 10^{18}$ atoms/cm$^3$.

It is without saying that also in this process, an ion implantation method with mass separation may be used or a plasma doping method without mass separation may be used. Furthermore, a practitioner may set conditions such as an accelerating voltage and a dose amount at the optimum values.

According to the process, the source regions 50 and 51, the drain regions 52 and 53, the LDD regions 54 and 55 and the channel formation region 45 are defined.

In the embodiment, an example where the LDD regions are formed by use of the masking film 44 is shown. However, the LDD regions can be formed by use of a method that uses a sidewall.

In the next place, heat treatment is applied in a nitrogen atmosphere at a temperature in the range of from 300 to 550 degree centigrade for from 1 to 12 hours. In the embodiment, the heat treatment is performed at 410 degree centigrade for 1 hour in a nitrogen atmosphere.

The protective film 43 on the gate electrode formed in the embodiment is disposed to inhibit the gate electrode from being oxidized in a thermal activation process. However, the protective film 43 is not necessarily formed immediately after the formation of the gate electrode. That is, when a protective film is disposed thereon after a first interlayer insulating film that is formed after this is formed followed by thermally activating an impurity element, a similar effect can be obtained.

Figure 6D:
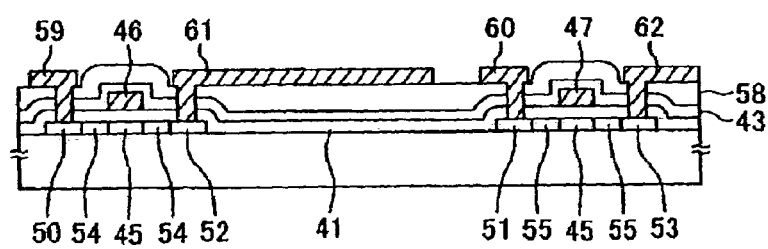

When a state shown in FIG. 6C has been obtained, a first interlayer insulating film 58 is formed on the protective film 43 as shown in FIG. 6D. In the embodiment, a silicon oxide film that is formed by means of the plasma CVD method and has a thickness of 1 µm is used. Here, the hydrogenation process is applied. In the process, an entire substrate is exposed to hydrogen that is excited (activated) by plasma or heat. A hydrogenation temperature may be set at a temperature in the range of from 350 to 450 degree centigrade (preferably from 380 to 420 degree centigrade) in the case of the thermal excitation being applied.

In the next place, contact holes respectively positioned on the source region and the drain region are formed in the first interlayer insulating film 58, the protective film 43 and the gate insulating film 41. Subsequently, source electrodes 59 and 60, drain electrodes 61 and 62 are formed in the contact holes and on the first interlayer insulating film 58. Thereby, the source electrodes 59 and 60 are electrically connected to the source regions 50 and 51, and the drain electrodes 61 and 62 are electrically connected to the drain regions 52 and 53. Thus, a state shown in FIG. 6D is obtained.

Figure 7A:
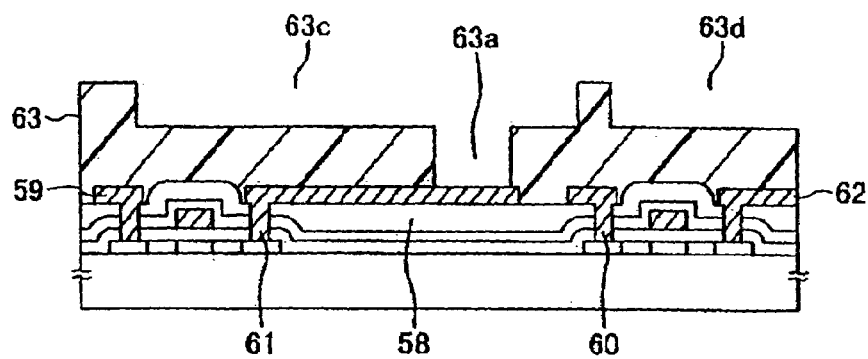
FIGS. 7A to 7C are sectional views showing a process following FIG. 6D and show a fabricating method of an AMLCD as one example of semiconductor devices according to Embodiment 1 of the presents invention.

Subsequently, on an entire surface including the source/drain electrodes, a second interlayer insulating film 63 is formed as shown in FIG. 7A. As the second interlayer insulating film 63, an organic resin film such as an acrylic resin film, polyimide film and so on can be used. As the need arises, in the second interlayer insulating film 63, films such as a black mask, auxiliary capacitance, electric field shielding film and so on can be formed.

Next, the second interlayer insulating film 63 is processed, and thereby, drain contact holes 63a positioned above the drain electrodes 61 and 62 and concave portions 63c and 63d are formed in the interlayer insulating film 63. As a method of processing the second interlayer insulating film 63, a processing method shown in FIG. 2 can be preferably used.

Figure 7B:
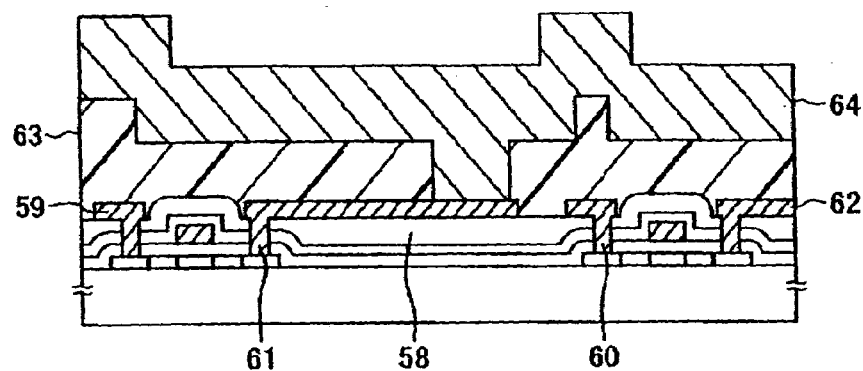

Thereafter, in the concave portions 63c and 63d and on the second interlayer insulating film 63, an ITO film 64 is formed by means of the sputtering method in the drain contact hole 63a as shown in FIG. 7B. A film thickness of the ITO film 64 is preferably one half a diameter of the drain contact hole or more and the whole of the inside of the drain contact hole is buried with the ITO film 64. Subsequently, as the need arises, the ITO film 64 is baked.

Figure 7C:
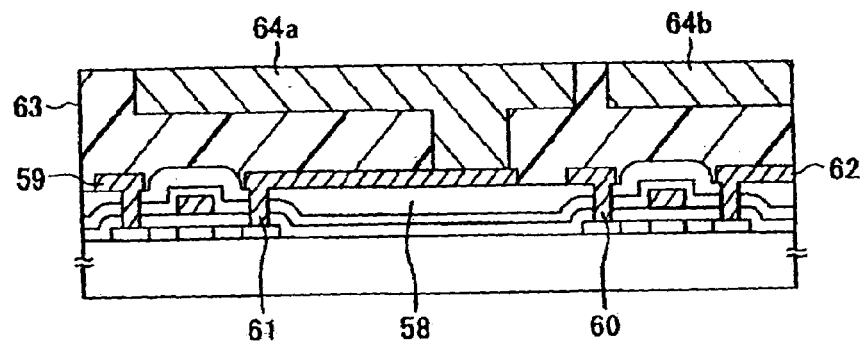

In the next place, the ITO film 64 is subjected to the CMP polishing as shown in FIG. 7C. At this time, the second interlayer insulating film 63 is used as a stopper. Thereby, the ITO film 64 is planarized, pixel electrodes 64a and 64b made of the ITO film buried in the concave portion of the second interlayer insulating film 63 are formed, and the pixel electrode 64a is electrically connected to the drain electrode 61 in the drain contact hole.

According to the Embodiment 1, by filling the ITO film 64 entirely in the drain contact hole 63a, steps due to the drain contact hole can be inhibited from occurring. Furthermore, steps between the second interlayer insulating film 63 and the pixel electrodes 64a and 64b made of the ITO film can be inhibited from occurring by filling the ITO film 64 entirely in the concave portions 63c and 63d and by applying the CMP polishing to the ITO film 64 with the second interlayer insulating film 63 as a stopper. Thereby the rubbing can be applied without being influenced by the steps and the alignment disturbance of the liquid crystal influenced by the steps can be suppressed from occurring, resulting in a decrease in the occurrence of the light leakage.

Furthermore, a separation between the pixel electrodes 64a and 64b made of the ITO film is preferably made narrower. It is because by making narrower the separation between the pixel electrodes made of the ITO film, a width of the black mask formed there below can be shortened and an aperture ratio can be improved. As a specific method, when the concave portions 63c and 63d are formed in the second interlayer insulating film 63, the wet etching is selected as the etching method, a side etching amount of the concave portion due to the wet etching is controlled a little bit larger, and thereby the separation between the pixel electrodes made of the ITO film can be made narrower for instance.

Still furthermore, it is also possible that the drain electrode 61 is extended up to a portion where widths of the concave portions 63c and 63d are widened by means of the side etching (that is, a lower portion of the resist pattern that is an etching mask), and therein the drain contact hole is formed.

Embodiment 2

Figure 8A:
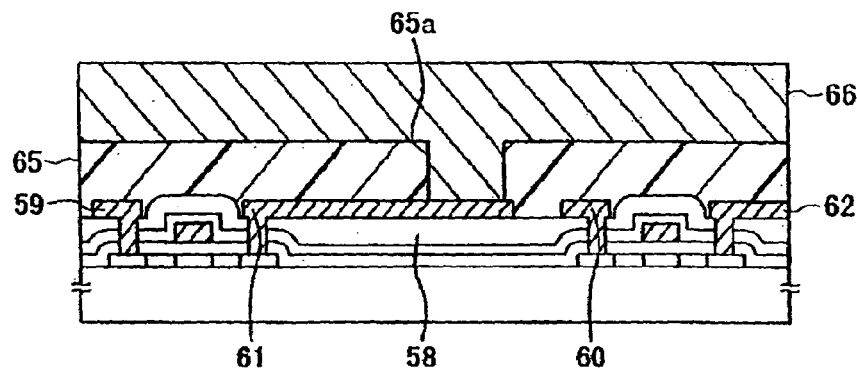
FIGS. 8 A to 8C are sectional views showing a fabricating method of an AMLCD as one example of semiconductor devices according to Embodiment 2 of the present invention.
Figure 8B:
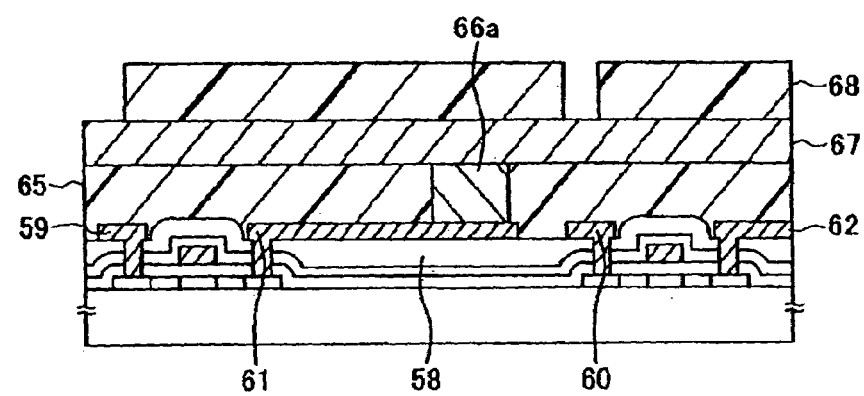
Figure 8C:
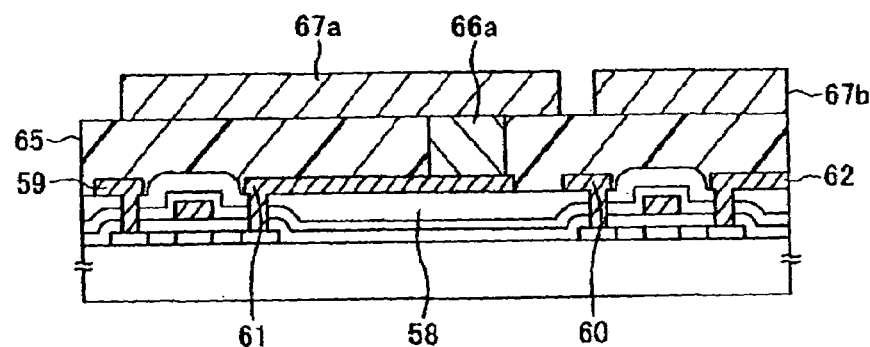

FIGS. 8A to 8C are sectional views showing a method of fabricating an AMLCD as an example of a semiconductor device according to Embodiment 2 according to the invention, the same portions as those of FIGS. 5A to 7C being given the same reference numerals.

Processes up to a process where source electrodes 59 and 60 and drain electrodes 61 and 62 shown in FIG. 8A are formed are the same as Embodiment 1.

In the next place, second interlayer insulating film 65 is formed on an entire surface including the source/drain electrodes. As the second interlayer insulating film 65, organic films such as an acrylic film, polyimide film and so on can be used. As the need arises, in the second interlayer insulating film 65, films such as a black mask, auxiliary film, electric field shielding film may be disposed.

Subsequently, the second interlayer insulating film 65 is subjected to the CMP polishing and thereby the interlayer insulating film 65 is planarized. Then, on the planarized interlayer insulating film 65, a resist film (not shown in the drawing) is coated followed by exposing and developing the resist film, and thereby a resist pattern is formed on the interlayer insulating film 65. In the next place, with the resist pattern as a mask, the second interlayer insulating film 65 is etched. At this time, either of the dry etching and the wet etching may be used. Thereby, in the interlayer insulating film 65, drain contact hole 65a positioned above the drain electrode 61 is formed. Subsequently, the resist pattern is peeled.

Subsequently, an ITO film 66 is formed in the drain contact hole 65a and on the first interlayer insulating film 65. A film thickness of the ITO film 66 is preferably one half a diameter of the drain contact hole or more, and the whole of the inside of the drain contact hole is buried with the ITO film 66. Then, the ITO film 66 is baked.

Thereafter, the ITO film 66 is etched back by an amount identical to a thickness of a deposited ITO film 66 as shown in FIG. 8B. Thereby the ITO film is buried in the drain contact hole 65a, the interlayer insulating film 65 including the embedded ITO film 66a is planarized, and the embedded ITO film 66a is electrically connected to the drain electrode 61 in the drain contact hole.

In the next place, an ITO film 67 is formed on the embedded ITO film 66a and the second interlayer insulating film 65. Subsequently, a resist film is coated on the ITO film 67 followed by exposing and developing the resist film, and thereby a resist pattern 68 is formed on the ITO film 67.

Subsequently, the ITO film 67 is etched with the resist pattern 68 as a mask. At this time, either of the dry etching and the wet etching may be used. Then, the resist pattern 68 is peeled. Thereby, pixel electrodes 67a and 67b made of the ITO film are formed on the embedded ITO film 66a and the second interlayer insulating film 65 as shown in FIG. 8C. Subsequently, the pixel electrodes 67a and 67b made of the ITO film are baked.

According to the Embodiment 2, by filling the embedded ITO film 66a in the whole of the inside of the drain contact hole 65a, steps due to the drain contact hole can be inhibited from occurring. Accordingly the rubbing can be performed without being influenced by the steps and the alignment disturbance of the liquid crystal influenced by the steps can be suppressed from occurring, resulting in a decrease in the occurrence of the light leakage.

Embodiment 3

Figure 9A:
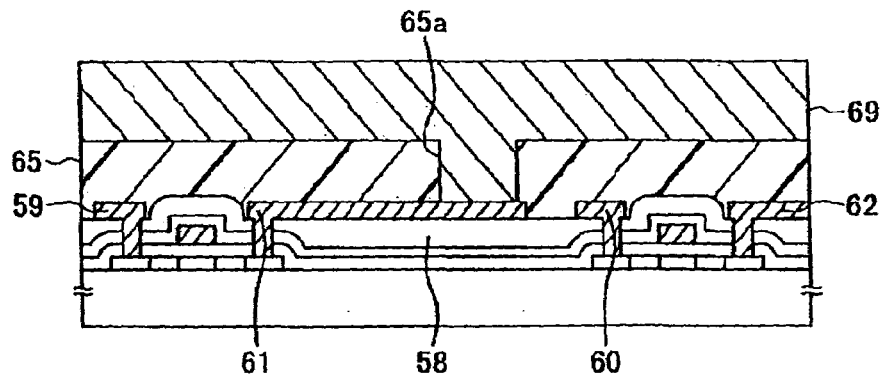
FIGS. 9A to 9C are sectional views showing a fabricating method of an AMLCD as one example of semiconductor devices according to Embodiment 3 of the present invention.
Figure 9B:
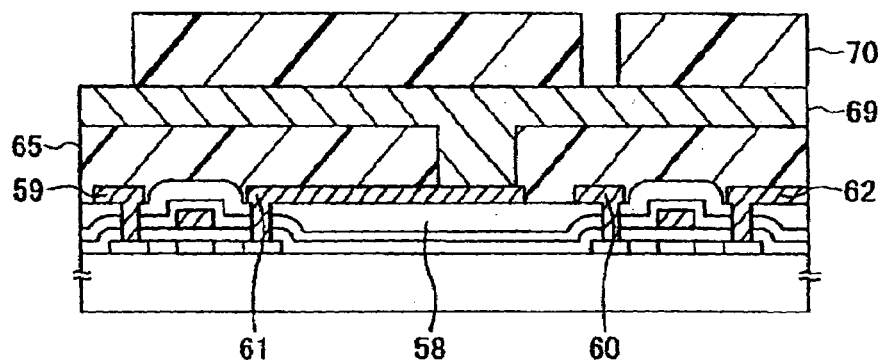
Figure 9C:
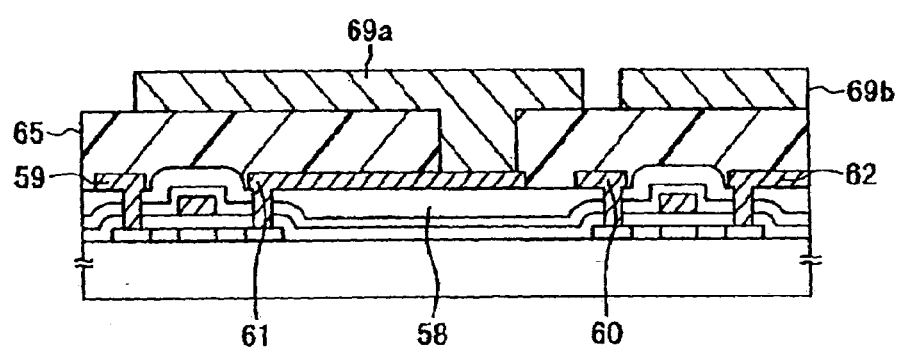

FIGS. 9A to 9C are sectional views showing a method of fabricating an AMLCD as an example of a semiconductor device according to Embodiment 3 of the present invention. In the drawing, the same symbols are used for the parts which are identical with FIGS. 8A to 8C.

The process through forming a second interlayer insulating film 65, and through forming a drain contact hole 65a shown in FIG. 9A is the same processes as Embodiment 2. Then, an ITO film 69 is formed on the drain contact hole 65a and on the second interlayer insulating film 65. The film thickness of the ITO film 69 is preferably equal to or more than half a diameter of the drain contact hole, and the inside of the drain contact hole is filled with the ITO film 69.

The film thickness of the ITO film 69 on the second interlayer insulating film 65 is controlled in the predetermined thickness through applying etching-back to the ITO 69 as shown in FIG. 9B. For example, the film thickness is controlled by etching time, as a controlling manner. Dry etching or wet etching can be used as etching-back. By this means, the inside of the contact hole 65a is filled with the ITO film 69, and the ITO film 69 is electrically connected to the drain electrode 61 in the drain contact hole. Further, a resist pattern 70 is formed onto the ITO film 69 by applying a resist film, then exposing and developing the resist film.

Next, the ITO film 69 is etched by using the resist mask 70 as a mask. On this occasion, wet etching or dry etching can be used as etching. Then the resist pattern 70 is separated. Pixel electrodes 69a and 69B composed of the ITO film is herewith formed on the second interlayer insulating film 65, and the pixel electrode 69a formed of the ITO film is electrically connected to the drain electrode 61 in the drain contact hole. The pixel electrode formed of the ITO film is baked.

In accordance with the above Embodiment 3, the occurrence of steps which is accompanied with a drain contact hole is controlled by filling the inside of the drain contact hole 65a to capacity with the ITO film 69. Therefore, a rubbing process can be performed without effect by the steps, the alignment disturbance of the liquid crystal due to steps can be controlled, and hence the occurrence of light leakage can be reduced.

The structure of the present invention is not limited to those in the above-mentioned Embodiments 1 to 3, and can be changed variously. For instance, a structure in which a black mask is provided for an active matrix substrate and a structure in which a black mask is provide to the facing substrate can be adopted in an AMLCD. In addition, the present invention can be utilized not only for a TFT but also for a wiring connection of a MOSFET formed on a single crystal silicon wafer. Also, the present invention can be applied not only to an AMLCD which drives in a reflection mode, but also to an AMLCD which drives in a transmission mode.

An AMLCD described in the above embodiments is utilized for a display of various electronic apparatuses. Still, the electronics apparatus here is defined as a product on which an active matrix liquid crystal device is mounted. As such electronic apparatuses, video cameras, still cameras, projectors, projections TVs, head mount displays, car navigations, personal computers including laptops, handheld terminals such as mobile computers and mobile phones can be cited.

As set forth, according to the present invention, a semiconductor device in which the occurrence of disclination caused by steps in a contact portion and steps in pixel electrodes is prevented and fabricating method thereof can be provided.

What is claimed is:

1. A semiconductor device comprising:
   an insulating film formed on an electrode;
   a contact hole formed in the insulating film and located on the electrode;
   a conductive film embedded in the contact hole; and a pixel electrode formed on the insulating film and the conductive film embedded in the contact hole,
wherein a part of an edge of the contact hole and a part of an edge of the pixel electrode are aligned.

2. The semiconductor device according to claim 1, wherein the electrode is a drain electrode of a TFT.

3. The semiconductor device according to claim 1, wherein the pixel electrode comprises an ITO (indium tin oxide) film.

4. The semiconductor device according to claim 1, wherein at least a part of the pixel electrode is baked.

5. The semiconductor device according to claim 1, wherein the semiconductor device is one selected from the group consisting of a video camera, a still camera, a projector, a projection TV, a head mount display, a car navigation, a personal computer, a mobile computer and a mobile phone.

6. A semiconductor device comprising:
an insulating film formed on an electrode;
a contact hole formed in the insulating film and located on the electrode;
a conductive film embedded in the contact hole; and
a pixel electrode formed on the insulating film and the conductive film embedded in the contact hole,
wherein a part of the conductive film embedded in the contact hole is not covered by the pixel electrode.

7. The semiconductor device according to claim 6, wherein the electrode is a drain electrode of a TFT.

8. The semiconductor device according to claim 6, wherein the pixel electrode comprises an ITO (indium tin oxide) film.

9. The semiconductor device according to claim 6, wherein at least a part of the pixel electrode is baked.

10. The semiconductor device according to claim 6, wherein the semiconductor device is one selected from the group consisting of a video camera, a still camera, a projector, a projection TV, a head mount display, a car navigation, a personal computer, a mobile computer and a mobile phone.

11. A semiconductor device comprising:
an insulating film formed on an electrode;
a contact hole formed in the insulating film and located on the electrode; and
a pixel electrode embedded in the contact hole and formed on the insulating film,
wherein a part of an edge of the contact hole and a part of an edge of the pixel electrode are aligned.

12. The semiconductor device according to claim 11, wherein the electrode is a drain electrode of a TFT.

13. The semiconductor device according to claim 11, wherein the pixel electrode comprises an ITO (indium tin oxide) film.

14. The semiconductor device according to claim 11, wherein at least a part of the pixel electrode is baked.

15. The semiconductor device according to claim 11, wherein the semiconductor device is one selected from the group consisting of a video camera, a still camera, a projector, a projection TV, a head mount display, a car navigation, a personal computer, a mobile computer and a mobile phone.

16. A method of fabricating a semiconductor device comprising steps of:
forming a first insulating film on an electrode;
forming a stopper film on the first insulating film;
forming a second insulating film on the stopper film;
etching the second insulating film with the stopper film as an etching stopper and thereby forming a concave portion in the second insulating film;
etching the stopper film and the first insulating film and thereby forming a contact hole in the stopper film and the first insulating film located below the concave portion and above the electrode after forming the concave portion;
forming a conductive film embedding the contact hole and the concave portion and on the second insulating film; and
forming a pixel electrode made of the conductive film embedded in the contact hole and the concave portion by one of a CMP polishing method and an etching-back method to the conductive film.

17. The method of fabricating the semiconductor device according to claim 16,
wherein the semiconductor device is one selected from the group consisting of a video camera, a still camera, a projector, a projection TV, a head mount display, a car navigation, a personal computer, a mobile computer and a mobile phone.

18. A method of fabricating a semiconductor device comprising steps of:
forming a first insulating film on an electrode;
forming a stopper film on the first insulating film;
forming a second insulating film on the stopper film;
etching the second insulating film, the stopper film and the first insulating film and thereby forming a contact hole in the second insulating film, the stopper film and the first insulating film located above the electrode;
etching the second insulating film with the stopper film as an etching stopper and thereby forming a concave portion connected to the contact hole in the second insulating film after forming the contact hole;
forming a conductive film embedding the contact hole and the concave portion and on the second insulating film; and
forming a pixel electrode made of the conductive film embedded in the contact hole and the concave portion by one of a CMP polishing method and an etching-back method to the conductive film.

19. The method of fabricating the semiconductor device according to claim 18,
wherein the semiconductor device is one selected from the group consisting of a video camera, a still camera, a projector, a projection TV, a head mount display, a car navigation, a personal computer, a mobile computer and a mobile phone.

20. A method of fabricating a semiconductor device comprising steps of:
forming an insulating film on an electrode;
etching the insulating film and thereby forming a concave portion in the insulating film;
etching the insulating film and thereby forming a contact hole in the insulating film located below the concave portion and above the electrode after forming the concave portion;
forming a conductive film embedding the contact hole and the concave portion and on the insulating film; and
forming a pixel electrode made of the conductive film embedded in the contact hole and the concave portion by one of a CMP polishing method and an etching-back method to the conductive film.

21. The method of fabricating the semiconductor device according to claim 20, wherein the semiconductor device is one selected from the group consisting of a video camera, a still camera, a projector, a projection TV, a head mount display, a car navigation, a personal computer, a mobile computer and a mobile phone.

22. A method of fabricating a semiconductor device comprising steps of:
   forming an insulating film on an electrode;
   etching the insulating film and thereby forming a concave portion in the insulating film;
   etching the insulating film and thereby forming a contact hole in the insulating film located below the concave portion and above the electrode;
   forming a conductive film embedding the contact hole and the concave portion and on the insulating film;
   removing a part of the conductive film located on the insulating film by one of a CMP polishing method and an etching-back method to the conductive film; and
   forming a pixel electrode on the insulating film and the remaining conductive film,
   wherein a part of an edge of the contact hole and a part of an edge of the pixel electrode are aligned.

23. The method of fabricating the semiconductor device according to claim 22,
   wherein the semiconductor device is one selected from the group consisting of a video camera, a still camera, a projector, a projection TV, a head mount display, a car navigation, a personal computer, a mobile computer and a mobile phone.

24. A method of fabricating a semiconductor device comprising steps of:
   forming an insulating film on an electrode;
   forming a contact hole in the insulating film located above the electrode;
   forming the first ITO film embedding the contact hole and on the insulating film;
   applying one of a CMP polishing and an etching-back to the first ITO film, and thereby removing the first ITO film on the insulating film with the remaining first ITO film embedded in the contact hole;
   baking the embedded first ITO film;
   forming a second ITO film on the insulating film and the embedded first ITO film; and
   etching the second ITO film, and thereby forming, on the insulating film and the embedded first ITO film, a transparent electrode made of the second ITO film,
   wherein a part of an edge of the contact hole and a part of an edge of the pixel electrode are aligned.

25. The method of fabricating the semiconductor device according to claim 24,
   wherein the semiconductor device is one selected from the group consisting of a video camera, a still camera, a projector, a projection TV, a head mount display, a car navigation, a personal computer, a mobile computer and a mobile phone.

26. A method of fabricating a semiconductor device comprising steps of:
   forming an insulating film on an electrode;
   forming a contact hole in the insulating film located above the electrode;
   forming a conductive film embedding the contact hole and on the insulating film;
   applying one of a CMP polishing and an etching-back to the conductive film, and thereby thinning a thickness of the conductive film on the insulating film; and
   etching the conductive film, and thereby forming a pixel electrode made of the conductive film on the insulating film,
   wherein a part of an edge of the contact hole and a part of an edge of the pixel electrode are aligned.

27. The method of fabricating the semiconductor device according to claim 26,
   wherein the semiconductor device is one selected from the group consisting of a video camera, a still camera, a projector, a projection TV, a head mount display, a car navigation, a personal computer, a mobile computer and a mobile phone.

* * * * *